United States Patent
Allais et al.

(10) Patent No.: US 10,756,225 B2
(45) Date of Patent: Aug. 25, 2020

(54) METHOD FOR MANUFACTURING A PHOTOVOLTAIC MODULE AND PHOTOVOLTAIC MODULE THUS OBTAINED

(71) Applicant: ARMOR, Nantes (FR)

(72) Inventors: François Allais, Basse Goulaine (FR); Damien Hau, Basse Goulaine (FR); Jeremiah Mwaura, Andover, MA (US)

(73) Assignee: ARMOR, Nantes (FR)

( * ) Notice: Subject to any disclaimer, the term of this patent is extended or adjusted under 35 U.S.C. 154(b) by 0 days.

(21) Appl. No.: 16/435,725

(22) Filed: Jun. 10, 2019

(65) Prior Publication Data

US 2019/0378945 A1 Dec. 12, 2019

(30) Foreign Application Priority Data

Jun. 11, 2018 (FR) ...................... 18 55064

(51) Int. Cl.
*H01L 31/05* (2014.01)
*H01L 31/042* (2014.01)
*H01L 31/18* (2006.01)

(52) U.S. Cl.
CPC .............. *H01L 31/0504* (2013.01)

(58) Field of Classification Search
CPC . H01L 31/0508; H01L 31/0465; H01L 31/05; H01L 31/18
See application file for complete search history.

(56) References Cited

U.S. PATENT DOCUMENTS

| 4,948,436 | A | * | 8/1990 | Juergens | ............... | H01L 31/076 136/244 |
|---|---|---|---|---|---|---|
| 7,932,124 | B2 | | 4/2011 | Brabee et al. | | |
| 2014/0166094 | A1 | * | 6/2014 | Loscutoff | ............... | H01L 31/18 136/256 |
| 2017/0373208 | A1 | * | 12/2017 | Bosman | .............. | H01L 31/0392 |

FOREIGN PATENT DOCUMENTS

| WO | 2011/032717 A2 | 3/2011 |
|---|---|---|
| WO | 2013/069267 A1 | 5/2013 |
| WO | 2016102326 A1 | 6/2016 |

\* cited by examiner

*Primary Examiner* — Susan D Leong
(74) *Attorney, Agent, or Firm* — Troutman Pepper Hamilton Sanders LLP

(57) ABSTRACT

A method for manufacturing a photovoltaic module, comprising at least two electrically connected photovoltaic cells, the module comprising an insulating substrate covered with a layer of a first conductive material. The method comprises: a) forming a groove defining a first and second lower electrode; and b) forming, on each lower electrode, a stack comprising an upper electrode and a photo-active layer. The method further comprises, between steps a) and b), forming: a first insulating step on the groove; then a conductive strip partially covering the first insulating strip; then a second insulating strip partially covering the conductive strip.

10 Claims, 2 Drawing Sheets

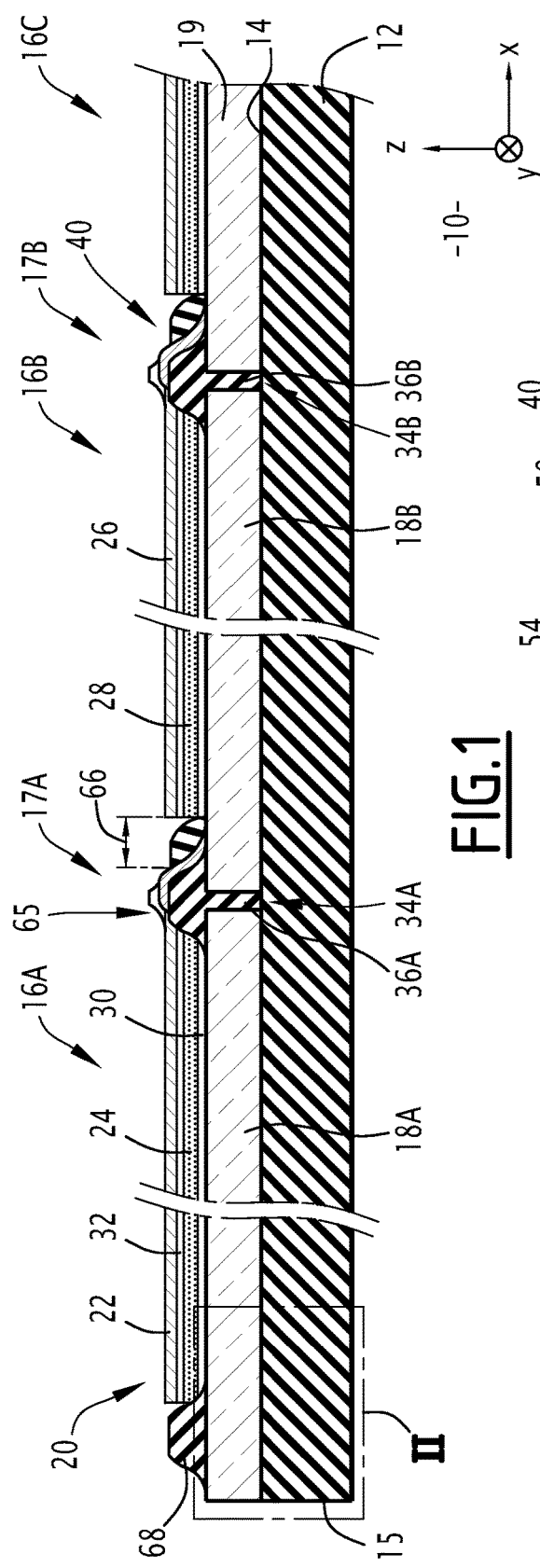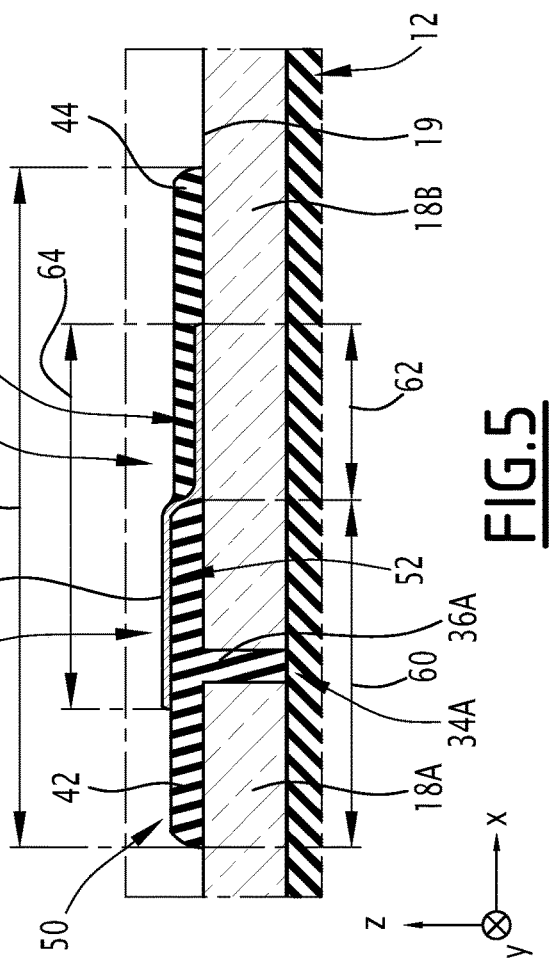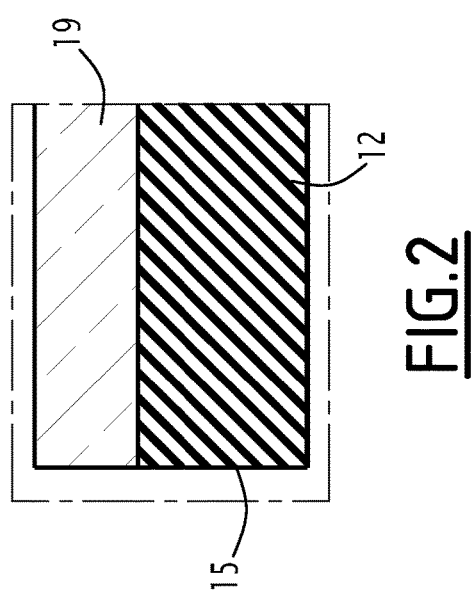

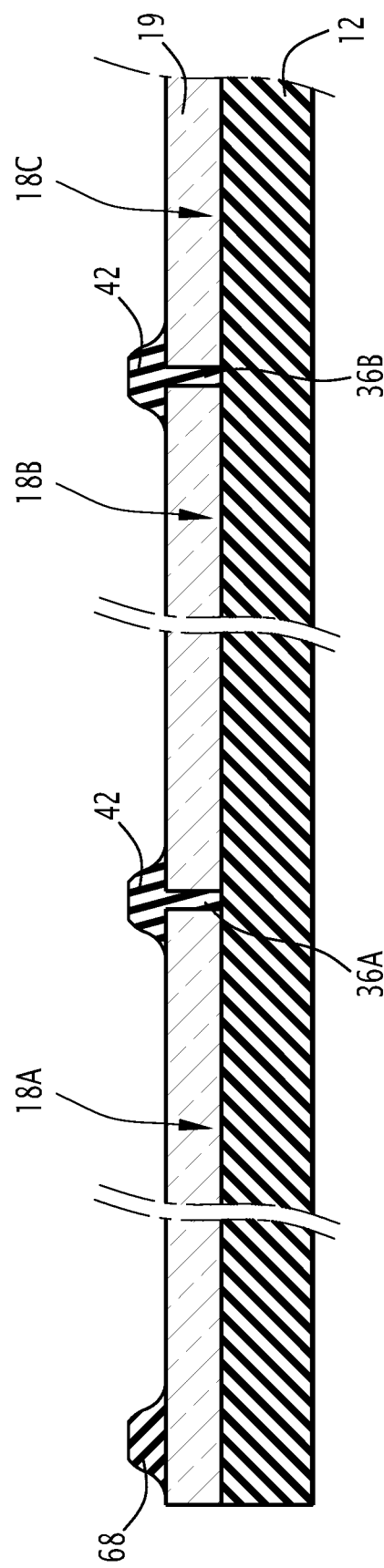
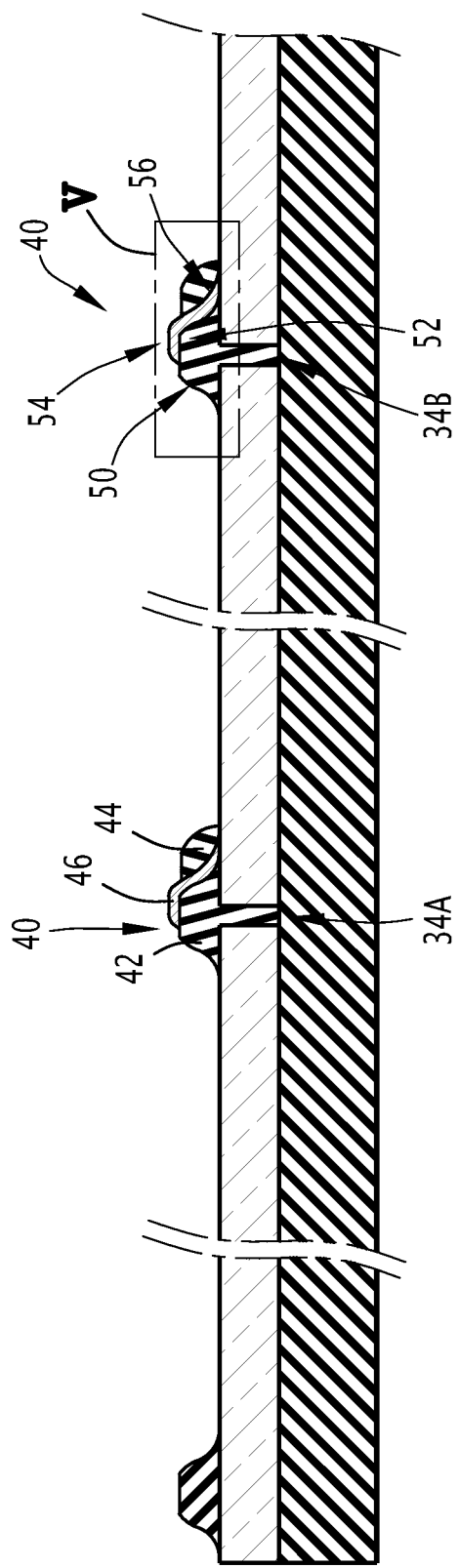
FIG.3
FIG.4

METHOD FOR MANUFACTURING A PHOTOVOLTAIC MODULE AND PHOTOVOLTAIC MODULE THUS OBTAINED

CROSS REFERENCE TO RELATED APPLICATION

The present application claims priority of French Patent Application No. 18 55064 filed Jun. 11, 2018. The entire contents of which are hereby incorporated by reference.

BACKGROUND

The present invention relates to a method for manufacturing a photovoltaic module, of the type comprising at least two electrically connected photovoltaic cells, said module comprising an insulating substrate covered with a layer of a first conducting material; the method comprising the following steps: a) forming, on the layer of first material, a groove defining first and second lower electrodes, isolated from one another; and b) forming, on each of said lower electrodes, a stack comprising at least: an upper electrode formed by a layer of a second conducting material; and at least one photo-active layer positioned between the lower and upper electrodes; each of the first and second lower electrodes respectively forming a first and second photovoltaic cell with the corresponding stack.

A photovoltaic module is an electronic component which, exposed to light, produces electricity. Such a photovoltaic module typically comprises several electrically connected photovoltaic cells. Each cell includes at least one photoactive material, i.e., able to produce electricity from light. Such a material is for example an organic semiconductor.

Photovoltaic modules of the aforementioned type are described in documents U.S. Pat. No. 7,932,124 an EP 2,478,559. Each cell of such a photovoltaic module is formed by a stack of strips, including a photo-active layer between two electrodes, said stack of strips being positioned on a substrate.

Such a stack, called active area, is separated into adjacent active areas by a so-called inactive area. Said inactive area allows electric isolation of the lower electrodes of two adjacent cells while connecting the upper electrode of each cell to the lower electrode of an adjacent cell. A photovoltaic module is obtained by forming several cells thus connected in series.

Generally, in large-scale production methods, the stack layers are made using a wet method, i.e., by depositing a liquid formulation followed by a passage to the solid state.

The performance of the photovoltaic module particularly involves producing the narrowest possible inactive areas, to maximize the size of the active areas. The geometric fill factor (GFF) of the photovoltaic module is defined as a ratio between the sum of the areas of the active areas of the photovoltaic cells and a total area of the substrate. The higher the GFF is, the better the electrical performance of the photovoltaic module is. In particular, obtaining a high GFF requires mastering the geometry of the electrical connections.

However, the rheological and wettability properties of the formulations, as well as the physical properties of the substrates, induce edge effects on the strips deposited by the wet method. In document U.S. Pat. No. 7,932,124, the layers of the stack forming each cell are in particular made with decreasing widths, so as to arrange a stair-stepped lateral offset. Such a production method makes it more complex to implement through large-scale production methods and contributes to decreasing the size of the active areas.

In document EP 2,478,559, the stack is first made uniformly on the entire module, then different grooves are formed in the layers in order to form the inactive zones. This method requires selective ablation means, the different grooves having different depths depending on their role in the inactive zone.

The present invention aims to propose a method for manufacturing a photovoltaic module in particular making it possible to minimize the size of the inactive areas and to maximize that of the active areas.

SUMMARY

To such an end, the invention relates to a manufacturing method of the aforementioned type, wherein: step b) is carried out after step a); the method comprises the following steps: c) formation of a first insulating strip on the layer of first material, so as to cover a location of the groove; said first strip comprising a first and second adjacent portion, respectively oriented toward the first and toward the second lower electrodes; then d) formation of a conductive strip on the layer of first material, said conductive strip covering the second portion and leaving the first portion of the first insulating strip free; said conductive strip comprising a first and second adjacent portion, respectively oriented toward the first and toward the second lower electrode, said first portion forming a relief relative to the first insulating strip; then e) forming a second insulating strip on the layer of first material, said second strip covering the second portion and leaving the first portion of the conductive strip free; at least steps d) and e) being carried out between steps a) and b). Furthermore, in step b), the upper electrodes of the first and second photovoltaic cells are respectively formed in contact with, and away from, the first portion of the electrically conductive strip.

According to other advantageous aspects of the invention, the manufacturing method includes one or more of the following features, considered alone or according to all technically possible combinations:
  step c) is done between steps a) and b), the first insulating strip further being formed in the groove;
  at least one of the first and second insulating strips is made by depositing a first liquid formulation comprising electrically insulating materials, followed by a passage to the solid state of said first formulation;
  the conductive strip is made by depositing a second liquid formulation comprising electrically conductive materials, followed by a passage to the solid state of said second formulation;
  the passage to the solid state of the second formulation comprises heating to a temperature above 120° C.;
  the at least one of the first and second insulating strips and the conductive strip is formed by a coating or printing technique using a continuous wet method, preferably chosen from among slot-die, photogravure, flexography and rotary serigraphy.

The invention further relates to a photovoltaic module derived from or able to be derived from a method as described above.

According to other aspects of the invention, the photovoltaic module includes one or more of the following features, considered alone or according to any technically possible combination(s):
  the first and second insulating strips and the conductive strip form, with the groove, an inactive zone separating two adjacent photovoltaic cells, a width of the inactive zone being between 0.30 mm and 1.60 mm;

a width of at least one of the first and second insulating strips is between 100 µm and 800 µm;

a width of the conductive strip is between 200 µm and 900 µm.

BRIEF DESCRIPTION OF THE DRAWINGS

The invention will be better understood upon reading the following description, provided solely as a non-limiting example and done in reference to the drawings, in which:

FIG. 1 is a sectional schematic view of a photovoltaic module according to one embodiment of the invention;

FIGS. 2 to 4 schematically show the steps for manufacturing the photovoltaic module of FIG. 1, using a method according to one embodiment of the invention; and FIG. 5 is a detail view of the manufacturing step of FIG. 4.

DETAILED DESCRIPTION

FIG. 1 is a sectional view of a photovoltaic module 10 according to one embodiment of the invention.

The photovoltaic module 10 particularly includes a substrate 12, formed by a film of electrically insulating material that is transparent to visible light, in particular of the polymer type. The substrate 12 particularly includes a substantially planar surface 14, delimited by at least one edge 15.

An orthogonal base (X, Y, Z) is considered, the surface 14 forming a plane (X, Y). In FIG. 1, the photovoltaic module 10 is shown with dimensions along Z stretched relative to the dimensions along X.

The photovoltaic module 10 includes at least two photovoltaic cells 16A, 16B, 16C, positioned on the substrate 12. The photovoltaic module 10 further includes at least one electrical connection 17A, 17B between two photovoltaic cells.

Each of the photovoltaic cells 16A, 16B, 16C is formed by a stack of strips positioned longitudinally along the direction Y. The length of the strips along Y can reach up to several hundreds meters.

Preferably, the photovoltaic module 10 includes a plurality of photovoltaic cells 16A, 16B, 16C, for example a number of photovoltaic cells greater than three. The photovoltaic module 10 preferably includes four, nine or twenty photovoltaic cells in the form of strips, the number of cells not being restricted to these values.

The photovoltaic cells 16A, 16B, 16C are substantially identical and adjacent along the direction X. The adjacent cells are connected by an electrical connection 17A, 17B.

A first photovoltaic cell 16A is adjacent along X to an edge 15 of the substrate 12, said edge 15 extending substantially along Y. A second photovoltaic cell 16B is positioned between the first 16A and a third 16C photovoltaic cells. Said second cell 16B is electrically connected to each of said first 16A and third 16C cells, respectively by a first 17A and a second 17B electrical connection.

The first 16A and second 16B photovoltaic cells will be described at the same time below. The third photovoltaic cell 16C, partially shown in FIG. 1, is considered to be identical to the second photovoltaic cell 16B.

Each photovoltaic cell 16A, 16B includes a lower electrode 18A, 18B in contact with the surface 14 of the substrate 12. The lower electrode 18A, 18B is formed by a layer of a first electrically conductive material 19, transparent to visible light. For information, the lower electrode 18A, 18B has a width along X of between 10 mm and 20 mm and a thickness along Z preferably below 1 µm. More preferably, said thickness is between 50 and 500 nm.

Each photovoltaic cell 16A, 16B further includes a stack 20 of layers of materials, positioned on the lower electrode 18A, 18B. The stack 20 comprises at least an upper electrode 22 and a photo-active layer 24.

The upper electrode 22 is formed by a layer of a second electrically conductive material 26, preferably a metallic material, preferably transparent to visible light. For example, said second electrically conductive material 26 is an ink with a base of silver nanoparticles or silver nanowires.

The photo-active layer 24, positioned between the lower 18A, 18B and upper 22 electrodes, is made of a photo-active material 28. The photo-active material 28 is of the semiconductive type. It is preferably an organic semiconductor. Advantageously, the photo-active material 28 comprises a mixture of at least one electron donor material, called p material, and at least one electron acceptor material, called n material. The photo-active material 28 is for example a close mixture, on the manometric scale, of said p and n materials. Alternatively, the photo-active layer 24 can be a heterojunction of p materials and n materials, in the form of a layer or a stack of several layers.

In the embodiment of FIG. 1, the stack 20 further includes a first 30 and second 32 interface layer, playing an electron transport role or serving as vias between the electrodes 18A, 18B, 22 and the photo-active layer 24. Each interface layer 30, 32 is positioned between said photo-active layer 24 and one of the lower 18A, 18B or upper 22 electrodes.

Each of the different layers of the stack 20 preferably has a thickness along Z of less than 10 µm, more preferably less than 1 µm.

Each photovoltaic cell 16A, 16B, 16C is separated from the or from each adjacent photovoltaic cell by an inactive zone 34A, 34B. For example, the first 16A and second 16B photovoltaic cells are separated by the inactive zone 34A; the second photovoltaic cell 16B is delimited along X by the inactive zones 34A and 34B.

In particular, the lower electrodes 18A, 18B are formed by the surfaces of first electrically conductive material 19 located away from the inactive zones 34A, 34B. Said surfaces define the so-called active zones of the photovoltaic module 10, corresponding to the photovoltaic cells 16A, 16B, 16C as such.

As previously indicated, the higher the geometric fill factor, or GFF, is, the better the electrical performance of the photovoltaic module 10 is. As described hereinafter, the photovoltaic module according to the present invention makes it possible to minimize the width of the inactive zones, so as to maximize the size of the active zones for a same substrate size, and thus to optimize the GFS.

Each inactive zone 34A, 34B comprises a groove 36A, 36B separating two adjacent lower electrodes. For example, the groove 36A is located between the first 18A and second 18B lower electrodes of the first 16A and second 16B photovoltaic cells; the second lower electrode 18B is positioned between the grooves 36A and 36B.

A bottom of the groove 36A, 36B is formed by the electrically insulating substrate 12. Thus, each groove 36A, 36B electrically insulates the lower electrodes situated on either side of said groove. For information, the groove 36A, 36B has a width along X of between 20 µm and 50 µm, preferably between 30 and 40 µm.

Each inactive zone 34A, 34B further comprises an assembly 40 in contact with the corresponding groove 36A, 36B. FIG. 5 shows a detail view of an inactive zone 34A, the dimensions along Z being less stretched than in FIG. 1 relative to the dimensions along X. The description below of the inactive zone 34A is valid for the other inactive zones of the photovoltaic module 10.

The assembly 40 comprises a first 42 and second 44 electrically insulating strip, as well as an electrically conductive strip 46, said strips 42, 44, 46 extending along Y.

The first electrically insulating strip 42 extends in the groove 36A and on either side of said groove, in the layer of first electrically conductive material 19. Said first electrically insulating strip 42 includes a first 50 and a second 52 adjacent portion along X. Said first 50 and second 52 portion are respectively oriented toward the first 16A and toward the second 16B photovoltaic cells.

The electrically conductive strip 46 extends over the second portion 52 of the first electrically insulating strip 42, as well as over the first electrically conductive material 19. On the contrary, the electrically conductive strip 46 is positioned away from the first portion 50 of the first electrically insulating strip 42.

The electrically conductive strip 46 includes a first 54 and a second 56 portion that are adjacent along X, respectively oriented toward the first 16A and toward the second 16B photovoltaic cell. Said first portion 54 forms a protrusion along Z relative to the first electrically insulating strip 42. Said second portion 56 is in contact with the first electrically conductive material 19.

The second electrically insulating strip 44 extends over the second portion 56 of the electrically conductive strip 46, as well as over the first electrically conductive material 19. On the contrary, the second electrically insulating strip 44 is positioned away from the first portion 54 of the first electrically conductive strip 46.

For information, each electrically insulating strip 42, 44 has a thickness along Z of between 5 μm and 40 μm, preferably between 10 μm and 20 μm; and the electrically conductive strip 46 has a thickness along Z of between 1 μm and 10 μm, preferably between 2 μm and 5 μm.

Preferably, a width 58 along X of the assembly 40, therefore of the inactive zone 34A, is between 0.30 mm and 1.60 mm. This small width makes it possible to maximize the size of the cells 16A, 16B.

More specifically, a width 60, 62 along X of each electrically insulating strip 42, 44 is preferably between 100 μm and 800 μm. Furthermore, a width 64 along X of the electrically conductive strip 46 is preferably between 200 μm and 900 μm.

As shown in FIG. 1, the different layers of the stack 20 formed on the first lower electrode 18A come, along X, into contact with the first portion 50 of the first electrically insulating strip 42 of the inactive zone 34A. Preferably, at least some layers of the stack 20 formed on the second lower electrode 18B come, along X, into contact with the second electrically insulating strip 44 of said inactive zone 34A.

The electrical connection 17A connecting the first 16A and the second 16A photovoltaic cells includes a junction 65 between the upper electrode 22 of said first cells 16A and the first portion 50 of the electrically conductive strip 46 of the inactive zone 34A. The upper electrode 22 of said first cell 16A is thus electrically connected to the second lower electrode 18B, by means of said electrically conductive strip 46.

On the contrary, a space 66 along X (FIG. 1) is arranged between the electrically conductive strip 46 of the inactive zone 34A and the upper electrode 22 of the second photovoltaic cell 16B.

Furthermore, the first photovoltaic cell 16A, adjacent to the edge 15 of the substrate 12, is separated from said edge 15 by an inactive end zone 68, formed by an electrically insulating strip extending along Y along said edge. For information, the inactive end zone 68 has a thickness along Z of between 10 μm and 20 μm and a width along X of between 400 μm and 800 μm. Preferably, at least some layers of the stack 20 formed on the first lower electrode 18A come, along X, into contact with the inactive end zone 68.

A method for manufacturing the photovoltaic module 10 above will now be described, based on FIGS. 2 to 5:

First (FIG. 2), the substrate 12 is provided, covered with a layer of the first electrically conductive material 19. Said material 19 is for example deposited on the surface 14 of the substrate 12 by coating of the solid surface type.

The grooves 36A, 36B are formed on said layer of material 19, in particular by mechanical or laser etching. A first electrically insulating strip 42 is formed in each groove 36A, 36B and on either side of said groove, on the material 19 (FIG. 3). Likewise, the inactive end zone 68 is formed on the material 19, along the edge 15.

According to the illustrated embodiment, the grooves 36A, 36B are formed first; then each first electrically insulating strip 42 is made in the corresponding groove 36A, 36B and on either side of said groove.

Each of the first electrically insulating strips 42 makes it possible to complete the electrical insulation between the adjacent photovoltaic cells. Indeed, the formation of an electrically insulating strip 42 in a groove 36A, 36B makes it possible to minimize any short-circuits between the adjacent lower electrodes 18A, 18B. Such short-circuits are in particular caused by debris generated during the formation of the groove by etching.

According to one alternative embodiment that is not shown, each first electrically insulating strip 42 is made on the location provided for the corresponding groove 36A, 36B, then each groove is formed by laser etching, through said first electrically insulating strip 42.

Indeed, laser etching does not produce debris capable of generating short-circuits. Additionally, the laser etching system makes it possible to etch the material 19 through the insulating strip 42. Indeed, the material of the insulating strip 42 being transparent at the wavelength of the laser, this strip 42 remains intact; while the energy from the laser ray being absorbed by the material 19, it makes it possible to etch this material.

It is thus possible to etch a groove 36A, 36B below an insulating band 42 previously formed.

After the formation of a groove 36A, 36B and a corresponding first electrically insulating strip 42, the electrically conductive strip 46 and the second electrically insulating strip 44 are made, to form the assembly 40 corresponding to each inactive zone 34A, 34B (FIGS. 4 and 5).

Preferably, the first electrically insulating strip 42 and/or the inactive end zone 68 are made by depositing a first liquid formulation comprising electrically insulating materials, followed by a passage to the solid state of said first formulation.

Preferably, the electrically conductive strip 46 and the second electrically insulating strip 44 are made by depositing, respectively, a second and a third liquid formulation, followed by a passage to the solid state of said second/third formulation.

The first and/or third liquid formulations for example comprises polymers prepared from materials such as amines, acrylates, epoxides, urethanes, phenoxys or combinations thereof. These insulating materials are deposited in solution, or without solvent when they are in liquid state at ambient temperature. According to one embodiment, the first and third formulations are substantially identical.

The second liquid formulation includes at least one electrically conductive material, which may be chosen from among: electrically conducting metals and alloys, in particular gold, silver, copper, aluminum, nickel, palladium, platinum and titanium; conducting polymers such as polythiophenes, polyanilines, polypyrroles; and metal oxides such as indium and tin oxide, fluorinated tin oxide, tin oxide, zinc oxide and titanium dioxide. The second liquid formulation optionally includes a solvent.

It should be noted that, the assembly 40 being made before the stack 20, any solvent entering the composition of the first, second and third liquid formulations can be chosen from among the solvents not orthogonal to said stack 20. Indeed, the method according to the invention eliminates the risk of etching or dissolving the stack 20 during the formation of the assembly 40.

At least one of the first 42 or second 44 electrically insulating strips or electrically conductive strip 46 is made using a coating technique or wet scrolling printing techniques, preferably chosen from among slot-die, photogravure, flexography and rotary screen printing. The precision of these techniques particularly makes it possible to form the electrically conductive strip 46 so as to define the desired geometry for the first 50 and second 52 portions of the first electrically insulating strip 42, as well as to form the second electrically insulating strip 44 so as to define the desired geometry for the first 54 and second 56 portions of the electrically conductive strip 46.

Optionally, the second and third liquid formulations are deposited successively, then simultaneously brought to the solid state, to form the electrically conductive strip 46 and the second electrically insulating strip 44.

The passage to the solid state of the second liquid formulation is preferably done by heating, in particular to temperatures above 120° C., or by exposure to infrared or ultraviolet rays. The same techniques can be used for the passage to the solid state of the first and third liquid formulations. Alternatively, said first and third liquid formulations are dried at ambient temperature or by heating below 120° C.

Next, the stack 20 of layers 30, 24, 32, 22 of materials is made on each lower electrode 18A, 18B. Each layer of the stack 20 can be formed owing to a wide range of techniques. The manufacturing methods compatible with large-scale production are preferably continuous methods, such as the scrolling or roll-to-roll methods.

Each of the different layers 30, 24, 32, 22 of the stacks 20 is preferably formed by a wet scrolling coating or printing technique, in particular chosen from among slot-die, curtain coating, knife coating, photogravure, heliography, rotary screen printing and flexography, then by drying of the layer. It should be noted that after the deposition of the photo-active layer 24, it is desirable not to expose the layer to temperatures above 120°, failing which it may suffer damage. Thus, it is advantageous to make the inactive zones 34A, 34B before the stack 20; indeed, a high drying temperature of the electrically conductive strip 46 makes it possible to improve the conductivity of said strip, therefore to decrease the resistance in series between the two adjacent photovoltaic cells.

Furthermore, certain techniques for forming the stack 20, such as flexography, heliography, screen printing and slot-die, implement machines including drive rollers. In this case, the inactive zones 34A, 34B form a physical protection along the axis Z of the coated surface. Such a protection makes it possible to limit the formation of defects on the various coated layers, by the contact between the driving rollers and the substrate to be coated.

In particular, the precision of the techniques indicated above, for the formation of the stack 20, makes it possible to arrange the space 66 along X between the electrically conductive strip 46 of the inactive zone 34A and the upper electrode 22 of the second photovoltaic cell 16B. Short-circuits between the first 16A and the second 16B photovoltaic cells are thus prevented.

Furthermore, the layer forming the upper electrode 22 of the first photovoltaic cell 16A is deposited so as to form the junction 65 along X with the first portion 54 of the electrically conductive strip 46 of the inactive zone 34A, forming the first electrical connection 17A. The second electrical connection 17B is formed similarly, between the second photovoltaic cell 16B and the inactive zone 34B.

The photovoltaic module 10 of FIG. 1 is thus obtained.

The invention claimed is:

1. A method for manufacturing a photovoltaic module, comprising at least two electrically connected photovoltaic cells, said module comprising an insulating substrate covered with a layer of a first electrically conductive material; the method comprising the following steps:

a) forming, on the layer of first material, a groove defining a first and a second lower electrodes, electrically isolated from one another; and b) forming, on each of said lower electrodes, a stack comprising at least: an upper electrode formed by a layer of a second electrically conductive material; and a photo-active layer positioned between the lower and upper electrodes; each of the first and second lower electrodes respectively forming a first and a second photovoltaic cell with the corresponding stack;

wherein step b) is carried out after step a);

the method further comprises the following steps:

c) formation of a first insulating strip on the layer of first material, so as to cover a location of the groove; said first insulating strip comprising a first and a second insulating portions, the first and second insulating portions being adjacent to each other, the first and second insulating portions being respectively oriented toward the first and toward the second lower electrodes; then d) formation of a conductive strip on the layer of first material, said conductive strip covering the second insulating portion and leaving the first insulating portion free; said conductive strip comprising a first and second conductive portions, the first and second conductive portions being adjacent to each other, the first and second conductive portions being respectively oriented toward the first and toward the second lower electrode, said first conductive portion forming a relief relative to the first insulating strip; then e) forming a second insulating strip on the layer of first material, said second insulating strip covering the second conductive portion and leaving the first conductive portion;

wherein at least steps d) and e) are carried out between steps a) and b); and wherein in step b), the upper electrodes of the first and second photovoltaic cells are respectively formed in contact with, and away from, the first conductive portion of the conductive strip.

2. The method according to claim 1, wherein step c) is done between steps a) and b), the first insulating strip further being formed in the groove.

3. The method according to claim 1, wherein at least one of the first and second insulating strips is made by depositing a first liquid formulation comprising electrically insulating materials, followed by a passage to the solid state of said first formulation.

4. The method according to claim 1, wherein the conductive strip is made by depositing a second liquid formulation comprising electrically conductive materials, followed by a passage to the solid state of said second formulation.

5. The method according to claim 4, wherein the passage to the solid state of the second formulation comprises heating to a temperature above 120° C.

6. The method according to claim 1, wherein the at least one of the first and second insulating strips and the conductive strip is formed by a coating or printing technique using a continuous wet method, preferably chosen from among slot-die, photogravure, flexography and rotary serigraphy.

7. A photovoltaic module derived from a method according to claim 1.

8. The photovoltaic module according to claim 7, wherein the first and second insulating strips and the conductive strip form, with the groove, an inactive zone separating two adjacent photovoltaic cells, a width of the inactive zone being between 0.30 mm and 1.60 mm.

9. The photovoltaic module according to claim 7, wherein a width of at least one of the first and second insulating strips is between 100 μm and 800 μm.

10. The photovoltaic module according to claim 7, wherein a width of the conductive strip is between 200 μm and 900 μm.

* * * * *